(12) United States Patent
Shirakawa et al.

(10) Patent No.: US 7,916,874 B2
(45) Date of Patent: Mar. 29, 2011

(54) GAIN ADJUSTING METHOD AND A GAIN ADJUSTING DEVICE

(75) Inventors: Miyuki Shirakawa, Fukuoka (JP);
Masanao Suzuki, Kawasaki (JP);
Yoshiteru Tsuchinaga, Fukuoka (JP);
Takashi Makiuchi, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 1238 days.

(21) Appl. No.: 11/447,994

(22) Filed: Jun. 7, 2006

(65) Prior Publication Data

US 2007/0223716 A1    Sep. 27, 2007

(30) Foreign Application Priority Data

Mar. 9, 2006   (JP) .................................. 2006-064546

(51) Int. Cl.
*H04R 25/00* (2006.01)
(52) U.S. Cl. ............ 381/56; 381/58; 381/320; 381/94.1
(58) Field of Classification Search .................. 381/312, 381/318, 321, 93, 94.1, 94.2, 94.3, 94.4, 381/94.8, 104, 107, 56, 58, 110; 704/200, 704/203–208
See application file for complete search history.

(56) References Cited

U.S. PATENT DOCUMENTS

| | | | |
|---|---|---|---|
| 4,381,488 A * | 4/1983 | Fricke et al. ..................... 333/14 |
| 4,630,302 A * | 12/1986 | Kryter ............................. 381/57 |
| 5,377,277 A | 12/1994 | Bisping |
| 5,450,494 A * | 9/1995 | Okubo et al. .................... 381/57 |
| 6,629,068 B1 | 9/2003 | Horos et al. |
| 6,687,669 B1 | 2/2004 | Schrögmeier et al. |
| 7,848,530 B2 * | 12/2010 | Wakui .......................... 381/94.1 |
| 2004/0057586 A1 * | 3/2004 | Licht ............................. 381/94.7 |

FOREIGN PATENT DOCUMENTS

| | | |
|---|---|---|
| EP | 1526639 A2 | 4/2005 |
| JP | 6-208395 | 7/1994 |
| JP | 08-070228 | 3/1996 |
| JP | 2000-122695 | 4/2000 |
| JP | 2004-219757 | 8/2004 |

OTHER PUBLICATIONS

Japanese Office Action mailed Jul. 27, 2010 issued with respect to corresponding Japanese patent application No. 2006-064546.
European Search Report, dated Jul. 14, 2006, for related European Patent Application No. EP06011837.9.

* cited by examiner

*Primary Examiner* — Curtis Kuntz
*Assistant Examiner* — Jasmine Pritchard
(74) *Attorney, Agent, or Firm* — Staas & Halsey LLP

(57) ABSTRACT

In a gain adjusting method and a gain adjusting device for adjusting gain of a processed voice signal that is obtained by signal processing of an input voice signal, a masking power of the processed voice signal is computed, and gain is adjusted for every frequency if the frequency is masked according to the masking power, such that a difference between the processed voice signal and the input voice signal where the frequency is not masked is canceled.

8 Claims, 9 Drawing Sheets

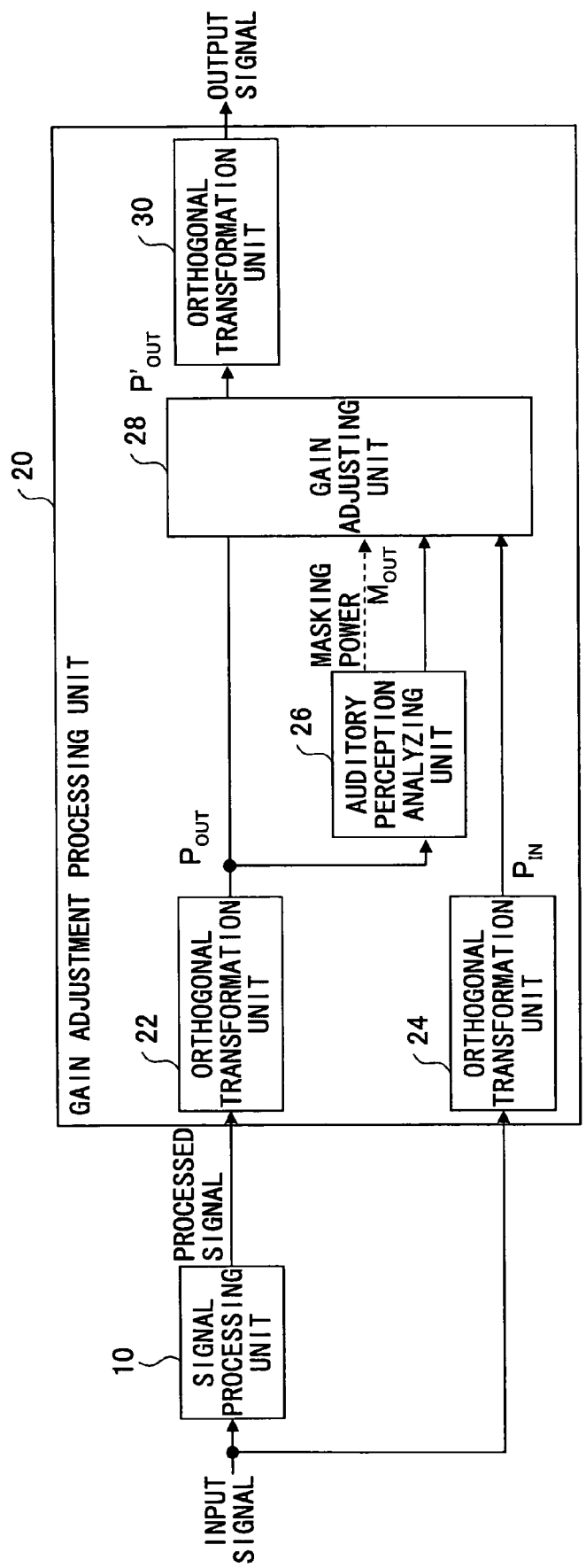

US 7,916,874 B2

GAIN ADJUSTING METHOD AND A GAIN ADJUSTING DEVICE

CROSS-REFERENCE TO RELATED APPLICATIONS

This application is based upon and claims the benefit of priority of Japanese patent application No. 2006-064546, filed on Mar. 6, 2006, the entire contents of which are incorporated herein by reference in their entirety.

BACKGROUND OF THE INVENTION

1. Field of the Invention

The present invention generally relates to a gain adjusting method and a gain adjusting device, and especially relates to a gain adjusting method and a gain adjusting device for adjusting gain of a voice signal to which signal processing is applied, and for outputting the gain-adjusted signal.

2. Description of the Related Art

The voice signal that includes speech and audio contents is often compression-coded to reduce information volume so that a smaller storage capacity when storing the contents in recording media and a lower transmission speed when transmitting the signal through a network such as the Internet and cellular phone systems may be utilized.

Further, various signal processing methods, such as a voice emphasis method, a noise canceller method, and an echo canceller method are typically used by IP telephone systems and cellular phone systems such that clarity of voice is enhanced. The signal processing methods tend to output a greater amount of power than the power of an input voice signal. For this reason, a gain adjustment process is provided so that the gain (level) of the output voice signal is properly controlled.

FIG. 1 is a block diagram of an example of a conventional gain adjusting device that includes a signal processing unit 1 for carrying out signal processing on an input voice signal, the signal processing including a voice emphasis method, a noise canceller method, and an echo canceller method; and a gain control unit 2 for controlling the gain (level) of the signal-processed voice signal so that the output level becomes equal to the input voice signal level.

In addition, Japanese Laid-Open Patent Publication No. 8-70228 discloses compensating for frequency characteristics of an audio signal, wherein the audio signal (an electric signal) is converted to voice and made audible, noise is extracted from the audio signal and a monitor signal of the voice, and the gain of the audio signal is determined in consideration of a masking effect based on the frequency spectrum of the noise.

An example is considered, wherein the voice emphasis processing is used in order to increase power of a formant, which is a peak of the frequency spectrum of the voice signal. That is, the power of the formants is increased as shown in FIG. 2A by the signal processing unit 1 of FIG. 1. When the power-increased spectrum is transformed into the time domain, the amplitude may exceed a limit, causing clipping to occur as shown in FIG. 2B, the clipping producing audible noise.

In order to prevent clipping, gain adjustment is performed by the gain control unit 2 of FIG. 1. Although generating of the noise by the excessive amplitude can be suppressed as shown in FIG. 3B, since the gain adjustment is conventionally carried out on the power of the whole spectrum, a problem is that the effect of the voice emphasis is reduced as shown in FIG. 3B.

SUMMARY OF THE INVENTION

The present invention provides a gain adjusting method and a gain adjusting device that substantially obviate one or more of the problems caused by the limitations and disadvantages of the related art.

Features of Embodiments of the present invention are set forth in the description that follows, and in part will become apparent from the description and the accompanying drawings, or may be learned by practice of the invention according to the teachings provided in the description. Problem solutions provided by Embodiments of the present invention will be realized and attained by a gain adjusting method and a gain adjusting device particularly pointed out in the specification in such full, clear, concise, and exact terms as to enable a person having ordinary skill in the art to practice the invention.

In order to achieve these solutions and in accordance with an aspect of the invention, as embodied and broadly described herein, Embodiments of the invention provide a gain adjusting method and a gain adjusting device that are capable of preventing clipping from occurring while the effect of signal processing is not sacrificed.

An aspect of the present invention provides a gain adjusting method of adjusting gain of a processed voice signal that is obtained by carrying out signal processing on an input voice signal, the processed voice signal being output to a next stage, the gain adjusting method including:

a step of computing a masking property of the processed voice signal; and a step of adjusting gain for each frequency of the processed voice signal, the frequency being masked according to the masking property, while a difference between the processed voice signal and the input voice signal for a frequency other than the frequency that is masked according to the masking property is cancelled. In this way, the amplitude of an output signal is not clipped, while an effect of signal processing is not degraded.

According to another aspect of the invention, the input voice signal and the processed voice signal are in the frequency domain.

According to another aspect of the invention, adjustment of the gain is carried out for each frequency band, i.e., band by band.

According to another aspect of the invention, adjustment of the gain is carried out for each frequency spectrum, i.e., spectrum by spectrum.

Another aspect of the invention provides a gain adjusting device for adjusting the gain of the processed voice signal that is obtained by carrying out signal processing on the input signal, the gain adjusting device including:

a masking property computing unit for computing the masking property of the processed voice signal; and an adjusting unit for adjusting the gain for each frequency of the processed voice signal, the frequency being masked according to the masking property, while a difference between the processed voice signal and the input voice signal, for a frequency other than the frequency that is masked according to the masking property, is cancelled. In this way, the amplitude of the output signal is not clipped, while the effect of signal processing is not degraded.

According to another aspect of the invention, the input voice signal and the processed voice signal handled by the gain adjusting device are in the frequency domain.

According to another aspect of the invention, the adjusting unit adjusts the gain for each frequency band.

According to another aspect of the invention, the adjusting unit adjusts the gain for each frequency spectrum.

Another aspect of the present invention provides a gain adjusting device that includes:

a first orthogonal transformation unit for carrying out orthogonal transformation of an input voice signal in the time domain to an input voice signal in the frequency domain;

a second orthogonal transformation unit for carrying out orthogonal transformation of a processed voice signal, which is obtained by performing signal processing on the input voice signal in the time domain, to a processed voice signal in the frequency domain;

a masking property computing unit for computing a masking property of the processed voice signal in the frequency domain;

a frequency selecting unit for selecting a frequency that is masked according to the masking property out of the processed voice signal in the frequency domain;

a gain determining unit for determining gain for every frequency out of the frequency selected by the frequency selecting unit, while a difference between the processed voice signal and the input voice signal in a frequency other than the frequency that is masked according to the masking property is cancelled;

a gain adjusting unit for adjusting the gain according to the gain determined by the gain determining unit for the frequency that is selected by the frequency selecting unit; and a third orthogonal transformation unit for carrying out orthogonal transformation of the voice signal in the frequency domain that is output by the gain adjusting unit to the voice signal in the time domain, and for outputting the voice signal in the time domain. In this way, the amplitude of the output signal is not clipped, while the effect of signal processing is not degraded.

According to the present invention, the amplitude of the output signal is not clipped, while preserving the effect of signal processing.

BRIEF DESCRIPTION OF THE DRAWINGS

FIG. 4 is a block diagram showing the principle of the gain adjusting device according to Embodiment 1 of the present invention;

DESCRIPTION OF THE PREFERRED EMBODIMENTS

Figure 1:
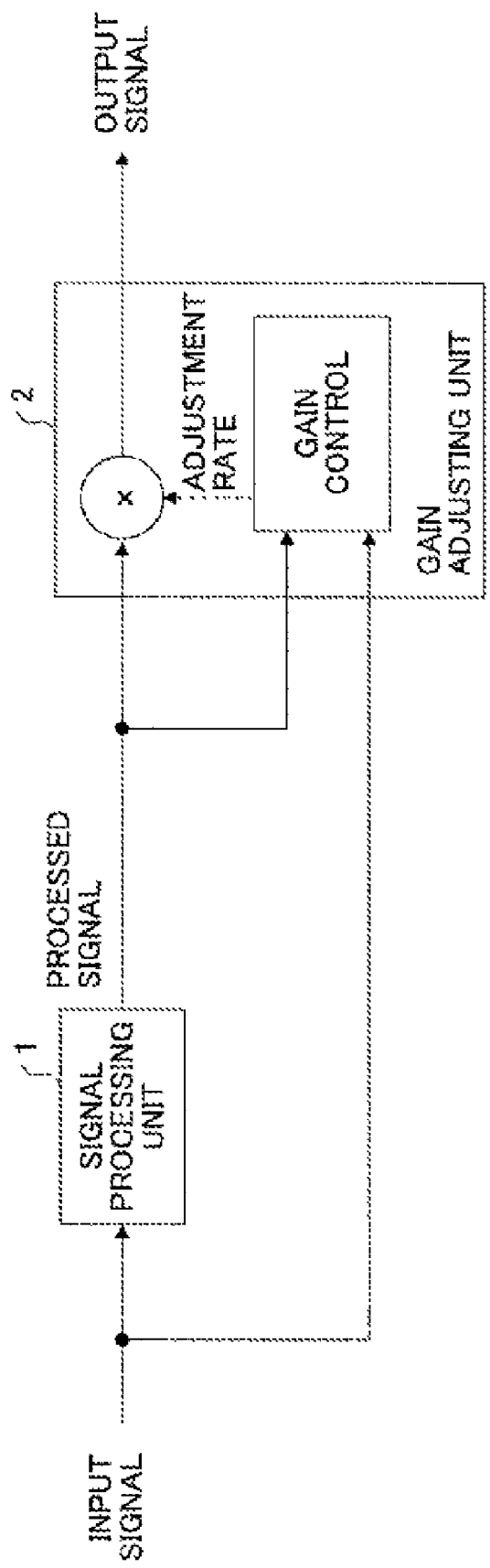
FIG. 1 is a block diagram of an example of a conventional gain adjusting device.
Figure 2A:
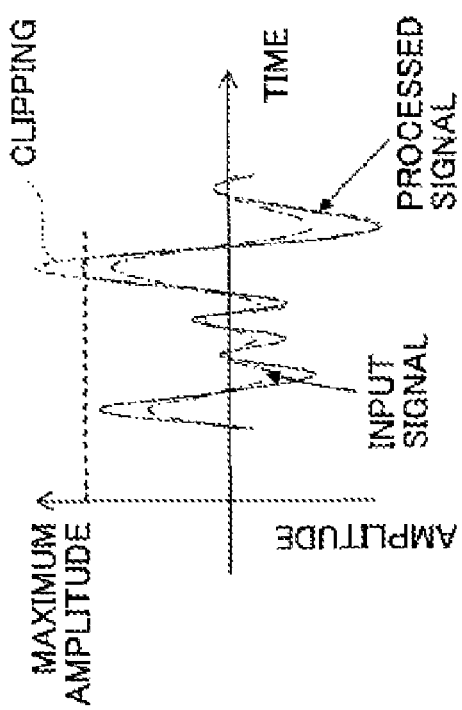
FIG. 2A and FIG. 2B are waveform charts for explaining the conventional example.
Figure 2B:
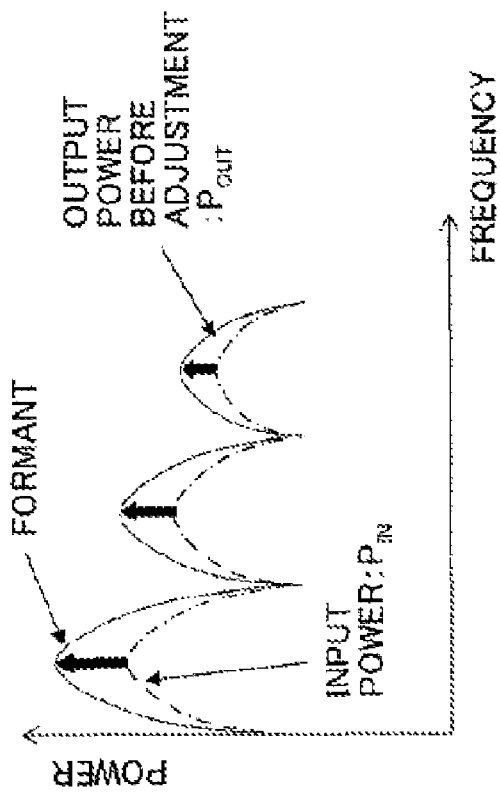
Figure 3A:
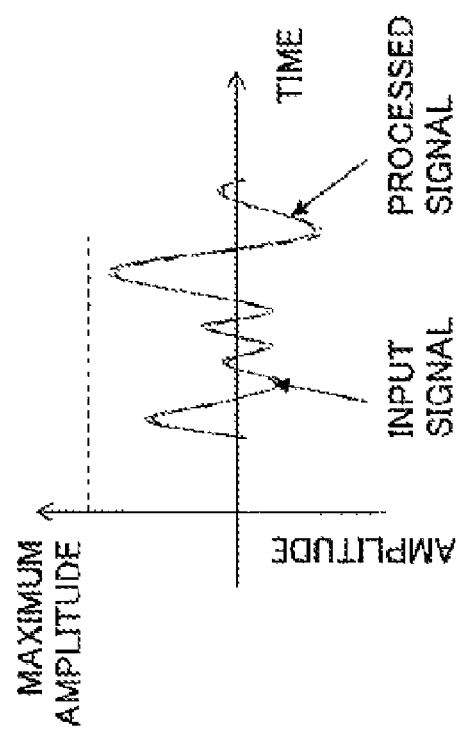
FIG. 3A and FIG. 3B are waveform charts for explaining the conventional example.
Figure 3B:
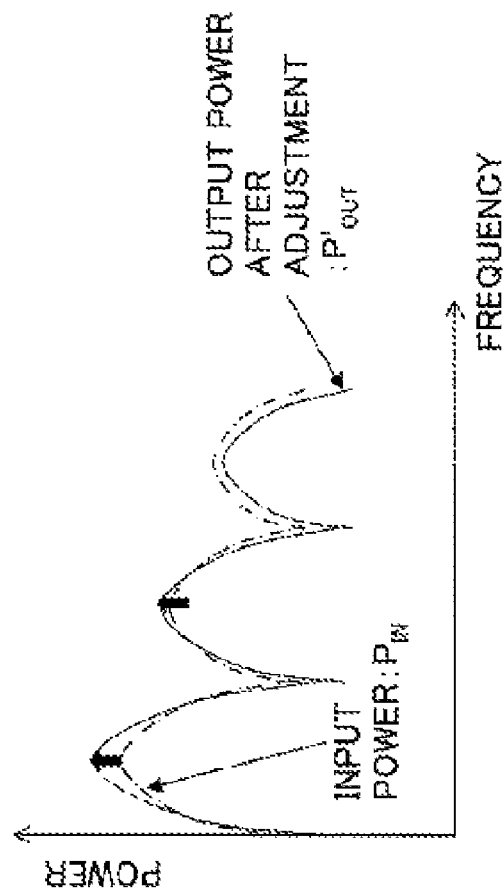

In the following, embodiments of the present invention are described with reference to the accompanying drawings.

<Principle of the Present Invention>

FIG. 4 shows the principle of a gain adjusting device according to Embodiment 1 of the present invention. An input voice signal is provided to a signal processing unit 10, which outputs a processed voice signal to the gain adjusting device. The gain adjusting device includes a gain adjustment processing unit 20 that includes orthogonal transformation units 22 and 24 for orthogonally transforming the input and the processed voice signals, respectively, into frequency spectrums, an auditory perception analyzing unit 26 for computing power of sound that is not audibly perceptible (masking power), and a gain control unit 28 for adjusting gain in consideration of the masking power.

The auditory perception analyzing unit 26 computes the masking power, which is the power of sound that is not audibly perceptible, based on the processed voice signal that is the target of power adjustment. The gain control unit 28 adjusts the gain of a frequency band of the processed voice signal, which frequency band is not audibly perceptible, such that the power of an output voice signal may become almost the same as that of the power of the input voice signal in consideration of the masking power.

Embodiment 1

Figure 5:
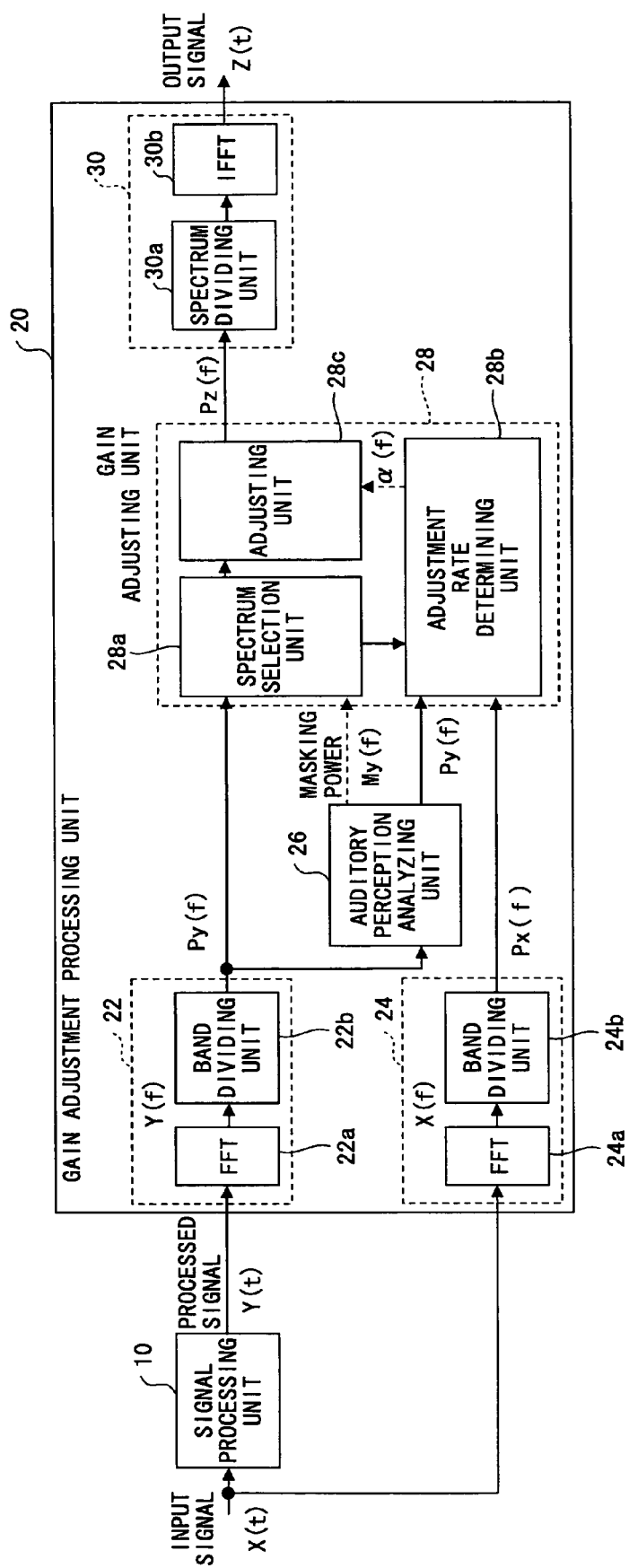
FIG. 5 is a block diagram of the gain adjusting device according to Embodiment 1 of the present invention.

FIG. 5 is a block diagram of the gain adjusting device according to Embodiment 1 of the present invention. With reference to FIG. 5, an input voice signal X(t) in the time domain is provided to the signal processing unit 10, wherein signal processing is performed, for example, a voice emphasis process is performed such that power of a formant, which is a peak of the frequency spectrum of the input voice signal, is increased. The voice signal processed as above is called a processed voice signal Y(t), and is provided to the gain adjustment processing unit 20.

The processed voice signal Y(t) is transformed into spectrum power Y(f) in the frequency domain by a FFT (Fast Fourier Transform) 22a of the orthogonal transformation unit 22. Further, the input voice signal X(t) is transformed into spectrum power X(f) in the frequency domain by a FFT 24a of the orthogonal transformation unit 24.

The spectrum power Y(f) is divided into N bands, each band having a minute bandwidth, by a band dividing unit 22b, and spectrum energy Py(f), which is a sum of spectrum power of the N bands, namely, Py(f)={Py(1), Py(2), - - - , Py(N)} is obtained. The spectrum power X(f) is divided into N bands, each having a minute bandwidth, by a band dividing unit 24b, and spectrum energy Px(f), which is a sum of spectrum power of the N bands, namely, Px(f)={Px(1), Px(2), - - - , Px(N)} is obtained.

The auditory perception analyzing unit 26 computes masking power My(f)={My(1), My(2), - - - , My(N)} based on the spectrum energy Py(f), and provides the masking power My(f) to a gain control unit 28. For computing the masking power My(f), a psycho-acoustic model indicated by a well-known reference (ISO/IEC 13818-7:2003 and Advanced Audio Coding) is used.

The gain control unit 28 includes a spectrum selection unit 28a for selecting a band, the spectrum energy Py(f) of which is masked, i.e., below the masking power My(f), by comparing the spectrum energy Py(f) with the masking power My(f). The selected band is a band for gain adjustment.

The gain control unit 28 further includes an adjustment rate determining unit 28b for determining an adjustment rate for each of the N bands, namely, α(f)={α(1), α(2), - - - , and α(N)}. Here, the adjustment rate corresponds to gain for each band.

Spectrum energy of the whole input voice signal and spectrum energy of the whole processed voice signal are expressed by ΣPx(f)=Px(1)+Px(2)+ - - - +Px(N), and Σy(f)=Py(1)+Py(2)+ - - - +Py(N), respectively. Then, a difference E between the energy of the processed voice signal and the energy of the input voice signal is expressed by the following formula (1).

$$E = \Sigma Py(f) - \Sigma Px(f) \quad (1)$$

Further, there is a relationship as expressed by the following formula (2) between the spectrum energy Py(f) of the processed voice signal and the adjustment rate α(f), which is equivalent to gain.

$$\sum [\alpha(f) Py(f)] = \alpha_1 Py_1 + \alpha_2 Py_2 + \cdots + \alpha_N Py_N \quad (2)$$

$$= (\alpha_1 \alpha_2 \cdots \alpha_N) \begin{pmatrix} Py_1 \\ Py_2 \\ \vdots \\ Py_N \end{pmatrix}$$

$$E = \sum [\alpha(f) Py(f)] - \sum Px(f) \quad (3)$$

$$= (\alpha_1 \alpha_2 \cdots \alpha_N) \begin{pmatrix} Py_1 \\ Py_2 \\ \vdots \\ Py_N \end{pmatrix} - \sum Px(f)$$

A difference E between the input voice signal and a gain-adjusted voice signal is expressed by the formula.

Here, α(f)={(1), α(2), - - - , α(N)} is determined such that the difference E between the input voice signal Px(f) and the spectrum energy α(f)Py(f) of the gain-adjusted voice signal becomes 0 as shown by the following formula (4).

$$(\alpha_1 \alpha_2 \cdots \alpha_N) \begin{pmatrix} Py_1 \\ Py_2 \\ \vdots \\ Py_N \end{pmatrix} - \sum Px(f) = 0 \quad (4)$$

The gain control unit 28 includes an adjusting unit 28c for acquiring spectrum energy Pz(f)={Pz(1), Pz(2), - - - , Pz(N)} by adjusting the spectrum energy Py(f) for each band according to the adjustment rate α(f) determined by the adjustment rate determining unit 28b, as expressed by the following formula (5).

$$Pz(f) = Py(f) \times \alpha(f) \quad (5)$$

The spectrum energy Pz(f) is converted into spectrum power Z(f) by a spectrum dividing unit 30a of the orthogonal transformation unit 30, and is transformed into a voice signal Z(t) in the time domain by an IFFT (Inverse FFT) unit 30b of the orthogonal transformation unit 30, and the voice signal Z(t) is output.

<When Y(t) is Greater than X(t)>

The first case is described, wherein the power of the processed signal Y(t) is greater than the power of the input signal X(t) and the gain of Y(t) is adjusted such that the power of the output signal Z(t) is decreased to the same level as the power of X(t).

Figure 6A:
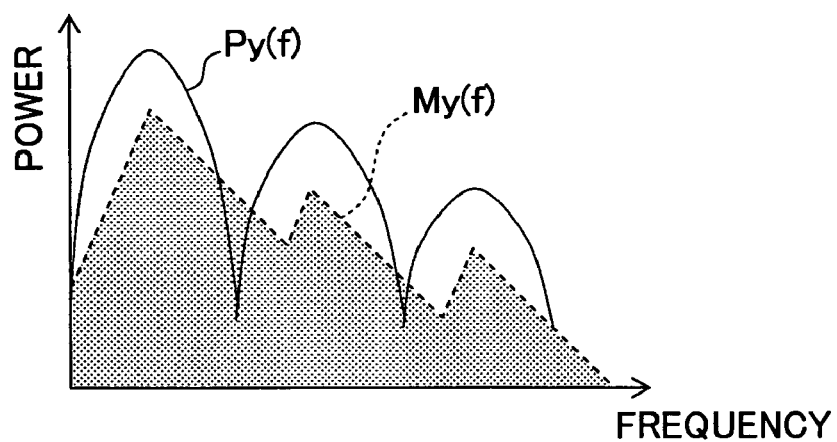
FIG. 6A and FIG. 6B are waveform charts for explaining the present invention.
Figure 6B:
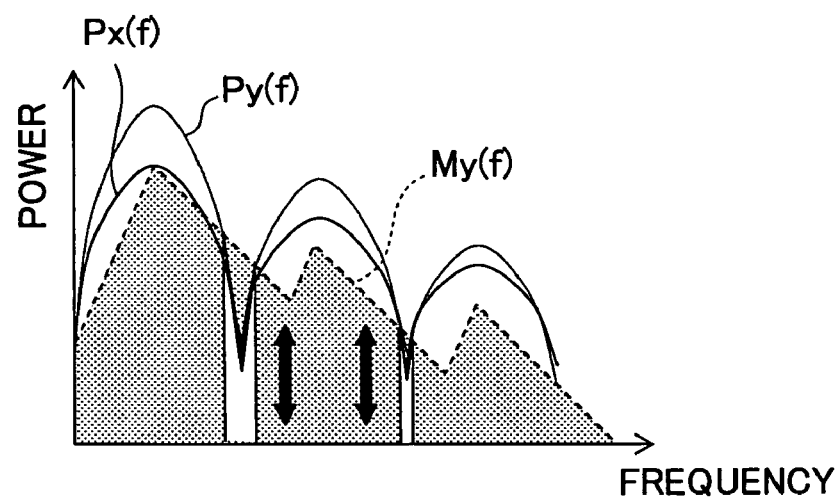
Figure 7B:
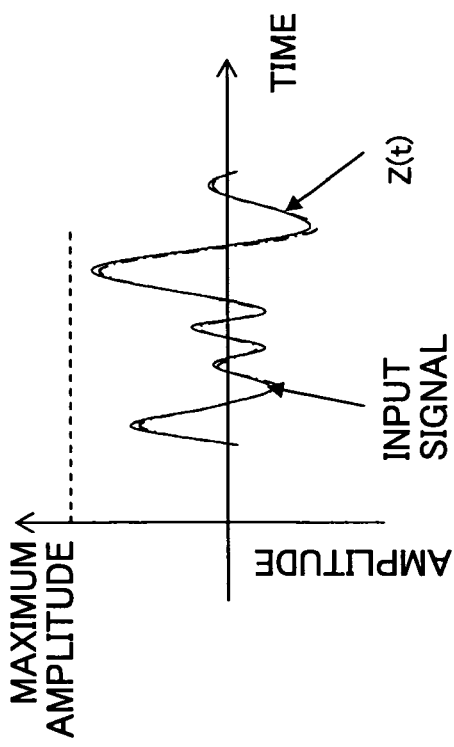
FIG. 7A and FIG. 7B are waveform charts for explaining the present invention.
Figure 7A:
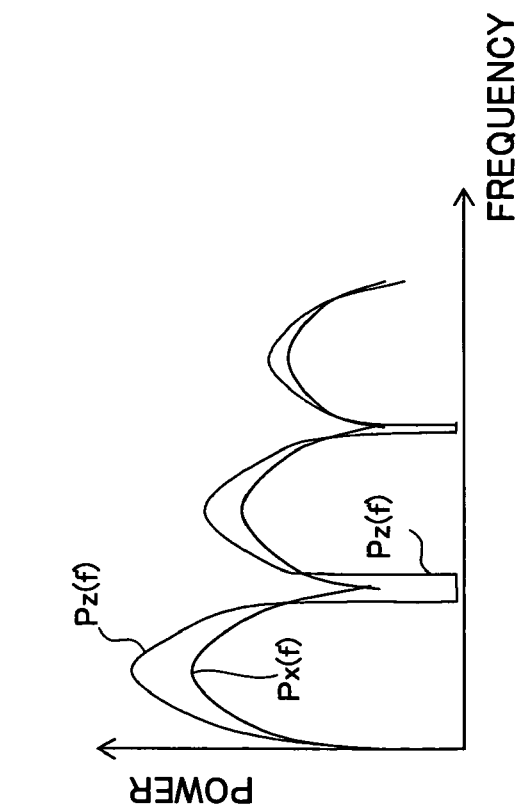

With reference to FIG. 6A, the masking power My(f) shown by a shaded area is obtained from the spectrum energy Py(f). In a zone where Py(f)>My(f), the gain adjustment is not applied, that is, α(f)=1. In a zone where Py(f)<My(f), the adjustment rate α(f) is set less than 1 so that the formula (4) is satisfied. In this way, the spectrum energy Pz(f) that is output after the adjustment is as shown in FIG. 7A. As a result, the output voice signal Z(t) in the time domain does not exceed the maximum of amplitude, and the amplitude of the output voice signal is not clipped as shown in FIG. 7B.

<When Y(t) is Smaller than X(t)>

Next, the second case is described, wherein the power of output the processed signal Y(t) is smaller than the power of the input signal X(t) and the gain of Y(t) is adjusted such that the power of output Z(t) is increased to the same level as the power of X(t).

Figure 8A:
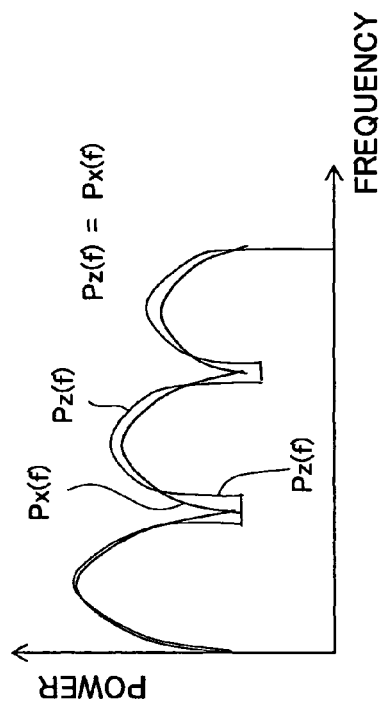
FIG. 8A, FIG. 8B and FIG. 8C are waveform charts for explaining the present invention.
Figure 8B:
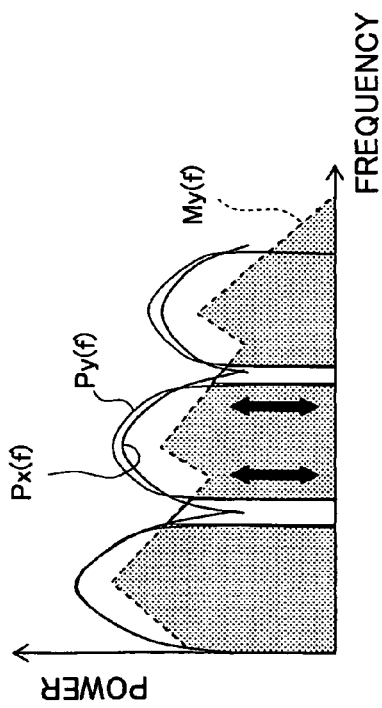
Figure 8C:
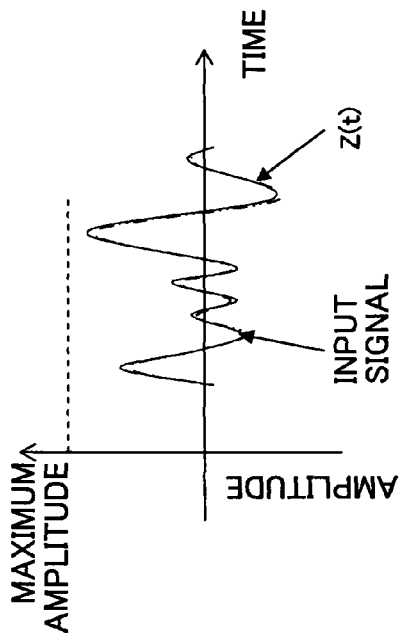

The masking power My(f) shown by a shaded area in FIG. 8A is obtained from the spectrum energy Py(f) shown in FIG. 8A. In the area of Py(f)>My(f), no adjustment is performed, that is, the adjustment rate α(f)=1. Where Py(f)<My(f), the adjustment rate α(f) is set to a value greater than 1 such that the value satisfies the formula (4) and satisfies α(f)Py(f)<My (f). In this way, the spectrum energy Pz(f) that is output after the adjustment is as shown in FIG. 8B. As a result, the output voice signal Z(t) in the time domain does not exceed the maximum amplitude, and the amplitude of the output voice signal is not clipped as shown in FIG. 8C.

As described above, according to Embodiment 1 of the present invention, it is possible to adjust the gain without degrading the effect of signal processing and tone quality by adjusting the power of a portion of the signal that is not audibly perceptible.

Here, although Embodiment 1 described above uses the FFT for converting the voice signal in the time domain into the voice signal in the frequency domain, a MDCT (Modified Discrete Cosine Transform) may be used instead of the FFT.

Embodiment 2

Figure 9:
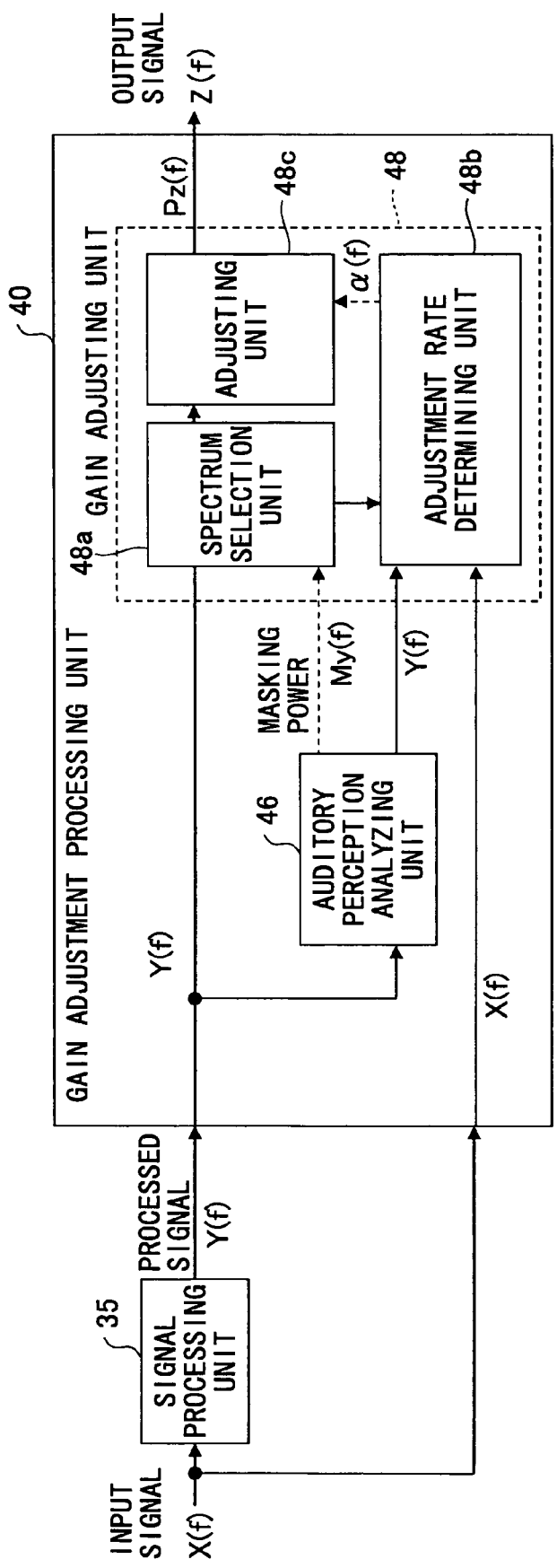
FIG. 9 is a block diagram of the gain adjusting device according to Embodiment 2 of the present invention.

FIG. 9 is a block diagram of the gain adjusting device according to Embodiment 2 of the present invention. According to Embodiment 2, spectrum power of the input voice signal in the frequency domain, namely, X(f)={X(1), X(2), - - - , X(N)}, is input, and spectrum power Z(f)={Z(1), Z(2), - - - , Z(N)} of the voice signal in the frequency domain is output. A signal processing unit 35 is for processing the input voice signal with, e.g., voice emphasis processing for increasing power of a formant, which is a peak of the frequency spectrum of the input voice signal. Spectrum power of the processed voice signal Y(f)={Y(1), Y(2), - - - , Y(N)} output by the signal processing unit 35 is provided to the gain adjustment processing unit 40.

Based on the spectrum power Y(f), an auditory perception analyzing unit 46 of the gain adjustment processing unit 40 computes the masking power My(f)={My(1), My(2), - - - , My(N)} for each spectrum, and provides the masking power to a gain control unit 48. The psycho-acoustic model indicated by a well-known reference (ISO/IEC 13818-7:2003 and Advanced Audio Coding) is used for computing the masking power My(f).

The gain control unit 48 includes a spectrum selection unit 48a for selecting a spectrum, the spectrum power Y(f) of which is masked, i.e., below the masking power My(f), by comparing the spectrum power Y(f) with the masking power My(f) spectrum by spectrum. The selected spectrum is a target of the gain adjustment.

The gain control unit 48 includes an adjustment rate determining unit 48b for determining the adjustment rate $\alpha(f)=\{\alpha(1), \alpha(2), ---, (N)\}$ corresponding to the gain.

Energy of the whole input voice signal and energy of the whole processed voice signal can be expressed by $\Sigma X(f)=X(1)+X(2)+ --- +X(N)$ and $\Sigma Y(f)=Y(1)+Y(2)+ --- +Y(N)$, respectively. Then, a difference E between the energy of the processed voice signal and the energy of the input voice signal is expressed by the following formula (6) formula.

$$E=\Sigma Y(f)-\Sigma X(f) \qquad (6)$$

Further, there is a relationship as expressed by the following formula (7) between the energy Y(f) of the processed voice signal and the adjustment rate $\alpha(f)$ corresponding to the gain.

[Equation 4]

$$\sum [\alpha(f)Y(f)] = \alpha_1 Y_1 + \alpha_2 Y_2 + \cdots + \alpha_N Y_N \qquad (7)$$

$$= (\alpha_1 \alpha_2 \cdots \alpha_N) \begin{pmatrix} Y_1 \\ Y_2 \\ \vdots \\ Y_N \end{pmatrix}$$

$$E = \sum [\alpha(f)Y(f)] - \sum X(f) \qquad (8)$$

$$= (\alpha_1 \alpha_2 \cdots \alpha_N) \begin{pmatrix} Y_1 \\ Y_2 \\ \vdots \\ Y_N \end{pmatrix} - \sum X(f)$$

A difference E between the input voice signal and a gain-adjusted voice signal is expressed by the formula (8).

$\alpha(f)=\{\alpha(1), \alpha(2), ---, (N)\}$ is determined such that the difference E between the energy of the gain-adjusted voice signal and the input voice signal becomes 0 as shown by the following formula (9).

$$(\alpha_1 \alpha_2 \cdots \alpha_N) \begin{pmatrix} Y_1 \\ Y_2 \\ \vdots \\ Y_N \end{pmatrix} - \sum X(f) = 0 \qquad (9)$$

The gain control unit 48 further includes an adjusting unit 48c for adjusting the gain of each spectrum of the spectrum power Y(f) according to the corresponding adjustment rate $\alpha(f)$ determined by the adjustment rate determining unit 48b as shown by the following formula (10), and spectrum power Z(f) is obtained and output.

$$Z(f)=Y(f)\times\alpha(f) \qquad (10)$$

Further, the present invention is not limited to these embodiments, but variations and modifications may be made without departing from the scope of the present invention.

What is claimed is:

1. A gain adjusting method which is performed to adjust a gain of a processed voice signal by using a gain adjusting device, the gain adjusting method comprising:

carrying out, by a first orthogonal transformation unit of the gain adjusting device, orthogonal transformation of a processed voice signal, which processed voice signal is obtained by carrying out signal processing of an input voice signal in a time domain, into a first spectrum power in a frequency domain;

generating, by a first band dividing unit of the gain adjusting device, a first spectrum energy from the first spectrum power wherein the first spectrum power is divided into N bands, each band having a predetermined bandwidth, and the first spectrum energy is represented by a sum of the divided spectrum powers of the N bands;

carrying out, by a second orthogonal transformation unit of the gain adjusting device, orthogonal transformation of the input voice signal in the time domain into a second spectrum power in a frequency domain;

generating, by a second band dividing unit of the gain adjusting device, a second spectrum energy from the second spectrum power wherein the second spectrum power is divided into N bands, each band having the predetermined bandwidth, and the second spectrum energy is represented by a sum of the divided spectrum powers of the N bands;

computing, by an auditory perception analyzing unit of the gain adjusting device, a masking power of the processed voice signal for each of the N bands, based on the first spectrum energy;

selecting, by a spectrum selection unit of the gain adjusting device, from among the N bands, bands in which the first spectrum energy is below the corresponding masking power of the processed voice signal;

determining, by an adjustment rate determining unit of the gain adjusting device, an adjustment rate for each of the N bands, such that a difference between a gain-adjusted spectrum energy, obtained as a result of gain adjustment of the first spectrum energy for the selected bands, and the second spectrum energy is equal to zero;

adjusting, by a gain adjusting unit of the gain adjusting device, respective spectrum powers of the first spectrum energy for the selected bands in accordance with the adjustment rates determined for the selected bands to generate the gain-adjusted spectrum energy; and carrying out, by a third orthogonal transformation unit of the gain adjusting device, inverse orthogonal transformation of the respective spectrum powers of the gain-adjusted spectrum energy in the frequency domain, into an output voice signal in a time domain, and outputting the output voice signal to an external device.

2. The gain adjusting method according to claim 1, wherein the input voice signal and the processed voice signal are in a frequency domain.

3. The gain adjusting method according to claim 2, wherein the adjusting adjusts the gain for each frequency band.

4. The gain adjusting method according to claim 2, wherein the adjusting adjusts the gain for each frequency spectrum.

5. A gain adjusting device, comprising:

a first orthogonal transformation unit to carry out orthogonal transformation of a processed voice signal, which processed voice signal is obtained by carrying out signal processing of an input voice signal in a time domain, into a first spectrum power in a frequency domain;

a first band dividing unit to generate a first spectrum energy from the first spectrum power wherein the first spectrum power is divided into N bands, each band having a predetermined bandwidth, and the first spectrum energy is represented by a sum of the divided spectrum powers of the N bands;

a second orthogonal transformation unit to carry out orthogonal transformation of the input voice signal in the time domain into a second spectrum power in a frequency domain;

a second band dividing unit to generate a second spectrum energy from the second spectrum power wherein the second spectrum power is divided into N bands, each band having the predetermined bandwidth, and the second spectrum energy is represented by a sum of the divided spectrum powers of the N bands;

an auditory perception analyzing unit to compute a masking power of the processed voice signal for each of the N bands, based on the first spectrum energy;

a spectrum selection unit to select, from among the N bands, bands in which the first spectrum energy is below the corresponding masking power of the processed voice signal;

an adjustment rate determining unit to determine an adjustment rate for each of the N bands, such that a difference between a gain-adjusted spectrum energy, obtained as a result of gain adjustment of the first spectrum energy for the selected bands, and the second spectrum energy is equal to zero;

a gain adjusting unit to adjust respective spectrum powers of the first spectrum energy for the selected bands in accordance with the adjustment rates determined for the selected bands to generate the gain-adjusted spectrum energy; and a third orthogonal transformation unit to carry out inverse orthogonal transformation of the respective spectrum powers of the gain-adjusted spectrum energy in the frequency domain, into an output voice signal in a time domain, and output the output voice signal to an external device.

6. The gain adjusting device according to claim 5, wherein the input voice signal and the processed voice signal are in a frequency domain.

7. The gain adjusting device according to claim 6, wherein the gain adjusting unit is configured to adjust the gain for each frequency band.

8. The gain adjusting device according to claim 6, wherein the gain adjusting unit is configured to adjust the gain for each frequency spectrum.

* * * * *